United States Patent [19]
Ohno et al.

[11] Patent Number: 5,618,639
[45] Date of Patent: Apr. 8, 1997

[54] MAGNETIC RECORDING MEDIUM AND MAGNETIC RECORDING APPARATUS

[75] Inventors: Tomoyuki Ohno, Hiratsuka; Yoshihiro Shiroishi, Hachiouji; Yotsuo Yahisa; Akira Osaki, both of Odawara; Yuichi Ootani, Yokohama, all of Japan

[73] Assignee: Hitachi, Ltd., Tokyo, Japan

[21] Appl. No.: 266,644

[22] Filed: Jun. 28, 1994

[30]   Foreign Application Priority Data

Jun. 28, 1993  [JP]  Japan .................................. 5-156701

[51] Int. Cl.⁶ .............................. G11B 5/66; B05D 5/12; C23C 14/00
[52] U.S. Cl. .................... 428/694 T; 428/336; 428/408; 428/694 TP; 428/694 TC; 428/694 TZ; 428/694 TF; 428/694 TR; 428/694 TS; 428/900; 427/127; 427/128; 427/129; 427/130; 427/131; 427/132; 369/272; 369/283; 360/128; 360/81
[58] Field of Search .................... 428/694 T, 694 TP, 428/694 TC, 694 TZ, 694 TF, 694 TR, 900, 694 TS, 408, 336; 427/127, 128, 129, 130, 131, 132; 369/272, 285; 360/128, 81; 204/192.1, 192.2, 192.22, 192.32

[56]  References Cited

FOREIGN PATENT DOCUMENTS 61-96512  5/1986  Japan .

OTHER PUBLICATIONS

"The Symposium on Memory and Advanced Recording Technologies (S.M.A.R.T.)" WS3–B–2, San Jose, CA, May 1986, pp. 1–25.

Journal of Colloid and Interface Science, V. 22, 1966, pp. 165–171.

*Primary Examiner*—Leszek Kiliman
*Attorney, Agent, or Firm*—Fay, Sharpe, Beall, Fagan, Minnich & McKee

[57]    ABSTRACT

A magnetic recording medium used in a magnetic recording apparatus has a non-magnetic substrate, a magnetic film formed on the substrate, an optional protective film formed on the magnetic film and a lubricating layer formed on the top surface of the medium. The lubricating layer is made of an organic polymer lubricant having molecules with an interstitial radius of not more that 0.31 nm. The interstitial radius is affected by coating the lubricant on the protective film after the protective film has been cleaned with a surface treatment, such as an oxygen plasma treatment or an ozone treatment. By maintaining the interstitial radius between molecules of the lubricant layer equal to or less than 0.31 nm, water and corrosive molecules in water cannot penetrate the lubricating layer and corrode the magnetic film. Also, the lubricant layer provides good sliding durability with a resultant long CSS life.

29 Claims, 2 Drawing Sheets

MAGNETIC RECORDING MEDIUM AND MAGNETIC RECORDING APPARATUS

FIELD OF THE INVENTION

The invention relates to a magnetic recording medium for use in a magnetic recording apparatus having a contact start and stop system for the magnetic head, which is spaced from the medium during read/write and contacts the medium during starting and stopping. The invention also relates to a magnetic recording apparatus using the magnetic recording medium.

BACKGROUND OF THE INVENTION

Magnetic recording mediums having a ferro magnetic metal thin film as a magnetic recording film exhibit good magnetic characteristics suitable for high density recording, but are disadvantageous in that the magnetic recording film is made of a metal thin film that is subject to corrosion and therefore liable to produce errors. Typically, the hardness of the film is so low that its durable resistance to sliding is inferior to that of filler-containing coating-type magnetic recording mediums.

Accordingly, it is common to use Co or alloys of Co—Ni to which approximately 10 weight % of Cr is added. Alternatively, as set forth in "The Symposium on Memory and Advanced Recording Technologies (S.M.A.R.T.)" WS3-B-2, pp. 1–25, San Jose, Calif., May (1986), a carbon protective film is provided on the magnetic recording film on which there is further formed a lubricating layer made of a polar or non-polar lubricant such as fluoroalkyl polyethers. As a result, the medium exhibits some resistance to wear caused by the sliding of a magnetic head on the surface of the medium.

As another example of manufacturing a magnetic recording medium having a protective film, Japanese Laid-Open Patent Application No. 61-96512 discloses a method for providing a protective film of carbon formed on a magnetic recording film. A lubricant is impregnated in the pores of the protective film.

SUMMARY OF THE INVENTION

The magnetic recording mediums set forth in the above-identified prior art are not directed to a high density recording medium, such as a hard disk, wherein a very small gap or spacing is provided during read/write between the magnetic head and the magnetic recording medium, of not greater than 0.2 µm, and wherein during contact start and stop, the magnetic head slides on the surface of the magnetic recording medium.

It is recognized that in order to ensure good durability with respect to sliding, a lubricating layer should be formed on the surface of the magnetic recording medium. If a relatively thick lubricating layer is formed, e.g. not smaller than 1 micron (254 angstroms), a relatively good corrosion resistance is ensured. However, the magnetic head is liable to stick to the magnetic recording medium when the lubricating layer is formed so thick. This affects the stable speed of the recording medium, which leads to transducing errors, and also presents a risk of damage to the magnetic head and the recording medium. On the other hand, when the lubricating layer is formed too thin, it is gradually worn down by the sliding of the magnetic head on the surface of the medium. As a result, the protective properties of the lubricating layer are diminished or lost, risking a head crush and/or corrosion of the magnetic film.

As another consideration, the protetive film underlying, the lubricating layer can be used for inhibiting corrosion of the magnetic film, however the protective film must be made thin. If the protective film is made thin, however, the corrosion resistance benefit of the protective film is reduced.

Accordingly, it is an object of the invention to provide a magnetic recording medium that has good durability to sliding, for example sliding contact with a magnetic head during CSS, and to provide strong resistance to corrosion of the thin magnetic film.

It is a further object of the invention to to provide a magnetic recording medium that has good durability to sliding, and strong resistance to corrosion of the thin magnetic film while providing a thin lubricating layer formed on the magnetic film or on a protective film formed on the magnetic film.

Another object of the invention is to provide a magnetic recording apparatus having one or more magnetic recording media having good durability to sliding and strong corrosion resistance.

DETAILED DESCRIPTION OF THE PREFERRED EMBODIMENTS

Figure 1:
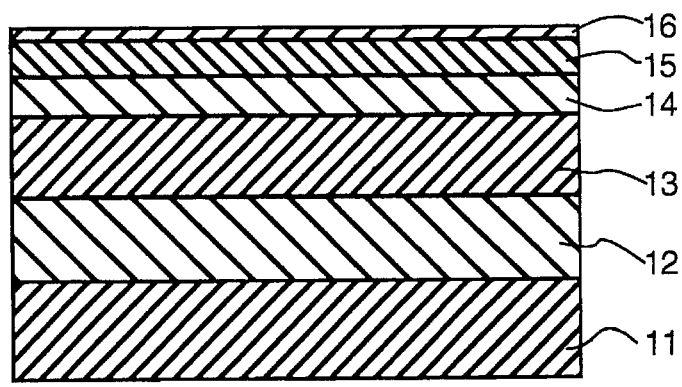
FIG. 1 is a sectional view of a portion of a magnetic recording medium according to an embodiment of the invention.

A magnetic recording medium for a magnetic recording apparatus according to the invention has a non-magnetic substrate, a magnetic film made of an alloy and formed on the substrate, and a lubricating layer formed on the magnetic film and made of an organic polymer lubricant. The organic polymer lubricant layer has a radius of interstice between the molecules of the layer that is not greater than 0.31 nm. It is preferred that the radius of interstice between the molecules is not greater than 0.28 nm. Although the lower limit of the interstitial radius is not critical, it is preferred in practice that the radius is not less than 0.17 nm.

The magnetic film may be formed on the non-magnetic substrate either directly or through an underlying film. The magnetic film may be made of alloys comprised mainly of Co or of alloys comprised mainly of Fe or iron oxide.

The lubricating layer may be formed directly on the magnetic film and is preferably formed on the magnetic film through a protective film. Carbides, nitrides and oxides of metals, and carbon may be used as the material for the protective film. The organic polymer lubricants used to form the lubricating layer should preferably be made of fluorine-containing organic compounds and organic compounds having a perfluoroalkyl chain or chains. More preferably, perfluoroalkyl polyethers are used. In order to ensure good adsorption with protective film, these organic compounds should preferably have a functional end group or groups such as a carbonyl group, carboxyl group, methoxcarbonyl group, sulfo group, sulfine group, amino group, azido group, piperonyl group, methylol group or similar groups. It is further preferred that one molecule thereof has two or more terminal functional groups in order to provide good covering properties.

The medium can be fabricated according to any of the following three fabrication procedures.

(1) If necessary, an under layer is formed on a non-magnetic substrate according to a sputtering process using Cr, Cr alloys or similar alloys as the target, after which a magnetic metal target such as a Co alloy is used to form a magnetic film. Subsequently, an optional protective film is further formed by sputtering, for example, using a target of carbon or metal carbides, nitrides or oxides. In particular, the protective film may be formed according to a reactive sputtering technique using Ar gas containing methane, oxygen, nitrogen or similarly functioning gases. The resultant medium substrate may be, if necessary to achieve the interstitial radius range of the invention, subjected to a treatment with ozone, an oxygen plasma procedure, a $CF_4$ plasma procedure or a similarly adequate cleaning method for cleansing the surface of the protective film and for providing adsorption groups on the surface of the protective film, thereby activating the surface, followed by immersion in a lubricant solution to form a lubricating layer. If necessary, excess lubricant may be removed by the application of a solvent to form the lubricating layer to a desired thickness.

(2) The medium substrate obtained above, i.e. the substrate, magnetic film and optional protective film combination (hereinafter medium substrate), may be, if necessary to achieve the interstitial radius range of the invention, subjected to surface modification according to a treatment with ozone, an oxygen plasma procedure, a $CF_4$ plasma procedure or a like procedure for cleaning the surface of the protective film and for providing adsorption groups on the surface of the protective film, followed by the formation of a lubricating layer on the surface thereof according to the Langmuir-Blodgett (LB) method.

(3) The medium substrate obtained above may be, if necessary to achieve the interstitial radius range of the invention, subjected to a cleansing of the surface of the protective layer and also to modification of the protective film surface according to a treatment with ozone, an oxygen plasma procedure, a $CF_4$ plasma procedure or a like procedure to provide adsorption groups and activate the surface, followed by formation of a lubricating layer by vacuum deposition. If necessary, excess lubricant may be removed from the lubricating layer by application of a solvent to form a lubricating layer of a desired thickness.

Also according to the invention, a recording apparatus is provided having one or more media fabricated as set out in any of the above fabrication techniques. The apparatus further includes a holder for holding the magnetic recording medium(s), a magnetic recording medium drive unit associated with the holder, magnetic heads provided in face-to-face relation with the respective sides of the magnetic recording medium(s), a magnetic head drive unit for driving the magnetic head, and a recording and reproducing signal processing unit for controlling the magnetic head drive.

The use of a head of the magnetic resistance effect type as the magnetic head of the invention is preferred because of the high sensitivity that can be obtained with such a head. In accordance with the invention, because there is attained high protection against the leakage of a signal detection current to the magnetic recording medium, reliability is remarkably improved.

The lubricating layer of the magnetic recording medium of the invention provides strong corrosion resistance for the magnetic film, good durability against the sliding movement of the magnetic head, and a minimal thickness which is as small as possible so as to suppress degradation of the magneto-electric conversion characteristics. In order to ensure good corrosion resistance of the magnetic film and to impart good durability against the sliding movement of the magnetic head, it is preferred that the lubricant be strongly adhered to the protective film and spread or distributed uniformly over the surface of the medium.

For magnetic recording mediums having a ferromagnetic metal thin film mainly composed of Co, it is usual to form, on the magnetic film, a protective film such as a carbon film, and a lubricating layer to ensure good resistance to sliding and corrosion. However, as recognized by the inventors, defects such as fine holes are present in the protective film and the magnetic film is relatively easily oxidized in a corrosive environment when using the protective film alone. The existence of the lubricating layer can prevent oxidation to an extent but complete prevention is not expected since the lubricating layer is very thin.

According to the inventors, corrosion is considered likely to occur for the following reason: oxidative molecules or molecules of water in the oxidative environment pass through interstices of the molecules of the lubricant on the protective film and also pass through the fine holes in the protective film, thereby causing the magnetic film to be oxidized.

To provide strong corrosion resistance, according to the present invention, the lubricating layer is formed after surface modification treatment of the magnetic film or the protective film. This increases the number of adsorption sites and allows the lubricant to be strongly, uniformly adsorbed on the surface of the protective film, so that the interstices between the molecules of the adsorbed or bonded portion can be reduced to a level not larger than 0.31 nm throughout the surface layer of the lubricant, for lubricants specified hereinafter. As a result, the molecules of water or oxidative molecules dissolved in water cannot migrate or pass through the lubricating layer and the protective film to the magnetic film, thereby preventing the magnetic film from being oxidized and providing the medium with a strong corrosion resistance. Further, it is more effective and preferred to make the surface of the lubricating layer to have interstices smaller than the radius of about four water molecules usually existing in an associated condition of approximately 0.28 nm. When the lubricant is strongly adsorbed and arranged on the surface of the protective film under conditions of small-size interstices, the medium's sliding durability is also improved.

The surface modification or cleaning treatment activates the surface of the protective film to provide the surface atoms to provide the surface atoms with free bonds to which the lubricant can chemically bond. It also provides adsorption groups, which are polarization bonding sites to which the lubricant can chemically bond. Examples of such bonding sites are individual carbon atoms on the surface of the protective film. After ozone cleaning of the protective film, for example, there is O and OH bonding of the carbon atoms across the entirety of the surface of the protective film (assuming a protective film having carbon atoms). If contaminants remain on the surface of the protective coating, i.e. in the absence of the cleaning step, they are physically bonded to the surface atoms of the protective film at sites that would otherwise be available for the lubricant to bond. Also, where the lubricant molecules bond to the surface around contaminants, interstices are present that are greater than 0.31 nm. Still further, the interstitial radius between molecules of the contaminants may exceed the maximum interstitial radius, e.g 0.31 nm. Thus, the interstices around the contaminant molecules or within or between contaminant molecules present on the surface of the protective film after the lubricating layer has been formed formed fail to prevent penetration of water molecules through to the magnetic layer.

By the present invention, the interstices between the molecules of the lubricant on the protective film are made smaller than the size of the molecules of water or an oxidant present in a corrosive environment to which the medium is subjected, and the corrosion resistance as well as the durability against sliding of the magnetic recording medium can be improved, thereby providing a magnetic recording medium and a magnetic recording apparatus incorporating such medium that are highly reliable. Further, the lubricating layer provides strong covering properties for the magnetic film and the protective film. Accordingly, when using a magnetic head of the magnetic resistance effect type, high protective capability against the leakage of a signal detection current to the magnetic recording medium is ensured with remarkable reliability.

The present invention is described herein by way of examples where reference is made to the accompanying drawings.

EXAMPLE 1

An aluminum alloy substrate was used to make a hard disk magnetic recording medium having a structure as shown in FIG. 1 according to a sputtering process. FIG. 1 shows one side of the magnetic recording medium but the medium which was fabricated had the layers on opposite sides thereof.

A rigid substrate 11 having an outer diameter of 130 mm, an inner diameter of 40 mm and a thickness of 1.9 mm and consisting of an Al alloy was provided, on which a 15 μm thick non-magnetic plated layer 12 consisting of Ni—P was formed. The non-magnetic plated layer 12 was formed on the surface thereof with fine irregularities (texture) by use of abrasive particles in such a way that a center line average roughness was 5 nm. A 100 nm thick underlying film 13 was formed on the substrate according to a sputtering process using a Cr target under conditions of a substrate temperature of 280° C., a DC voltage power flux density of 10 W/cm$^2$ and an Ar gas pressure of 2 mTorr. Under the same conditions as set out above, a 40 nm magnetic film 14 was formed on the underlying film 13 using a Co—14% Cr—2% Ta alloy target. Moreover, a 40 nm thick carbon protective film 15 was formed under the same conditions as set out above using a C target.

In a subsequent step, the carbon protective film 15 was subjected to etching to a depth of 5 nm at 150° C. at a concentration of ozone of 10,000 ppm to cleanse the surface thereof. Following the cleaning step, the disk was allowed to stand in an air-conditioned chamber of 40° C. and 90% R.H. for 1 hour to modify and activate the surface thereby forming adsorption groups thereof.

The disk was then coated with a lubricating layer 16 by immersing it in a perfluorooctane solution of 0.1% of a lubricant which was obtained by conversion of a perfluoroalkyl polyether having a carboxyl polar group at ends thereof into a low molecular weight material through fractional distillation and which had a molecular weight of approximately 1000. (Example 1a, see Table 1). Separately, another disk was fabricated wherein the (excess) lubricant other than the adsorbed lubricant was removed from the lubricating layer by means of a perfluorooctane solvent thereby leaving a monomolecular lubricant layer on the disk's surface (Example 1b). Further, the above procedures were, respectively, repeated using a perfluoroalkyl polyether having a molecular weight of about 1000 and a piperonyl group as a polar group at ends thereof, thereby obtaining magnetic recording mediums of Examples 1c and 1d.

The thickness of the lubricant film is dependent on the average texture roughness and the material of the lubricant. If the average texture height is 5 mn, a thick lubricant layer would be 20 mn. Such a thick layer would have a problem with head stickiness. If the average roughness is 2 nm, then a too thick layer would be 10 nm. The different thickness layers shown in the table relate to different heights of average texture of the substrate.

The thus obtained magnetic recording mediums (disks) were evaluated with the results shown in Table 1. The thickness of the deposited lubricant was determined from an infrared adsorption spectrum intensity. The interstitial radius of the molecules of the lubricant was determined according to the procedure set forth in Journal of Colloid and Interface Science, V. 22, pg. 165–171 (1966), which is incorporated herein by reference. In particular, the size of the interstices present in the molecules on the solid surface is determined by wetting the solid surface with a liquid and observing the hysteresis phenomenon of the respective liquid molecules which wet the solid surface, which are of different sizes. More particularly, the size of the molecular interstices on the solid surface is determined by a procedure which makes use of a hysteresis phenomenon wherein when the size of the liquid molecule is smaller than the interstice present in the molecular film on the solid surface, the liquid infiltrates into the interstices, so that a difference between the advancing contact angle and the receding contact angle of the liquid appears. Assuming the closest packing of the liquid molecules, the radius, r, of the molecule in the liquid state is calculated according to equation (1) wherein Mw is a molecular weight, N is Avogadro's number and ρ is a density.

In practice, various types of liquid molecules such as those of octane, nonane, decane, glycerine and the like are used and the difference between the angles of contact is measured.

Figure 2:
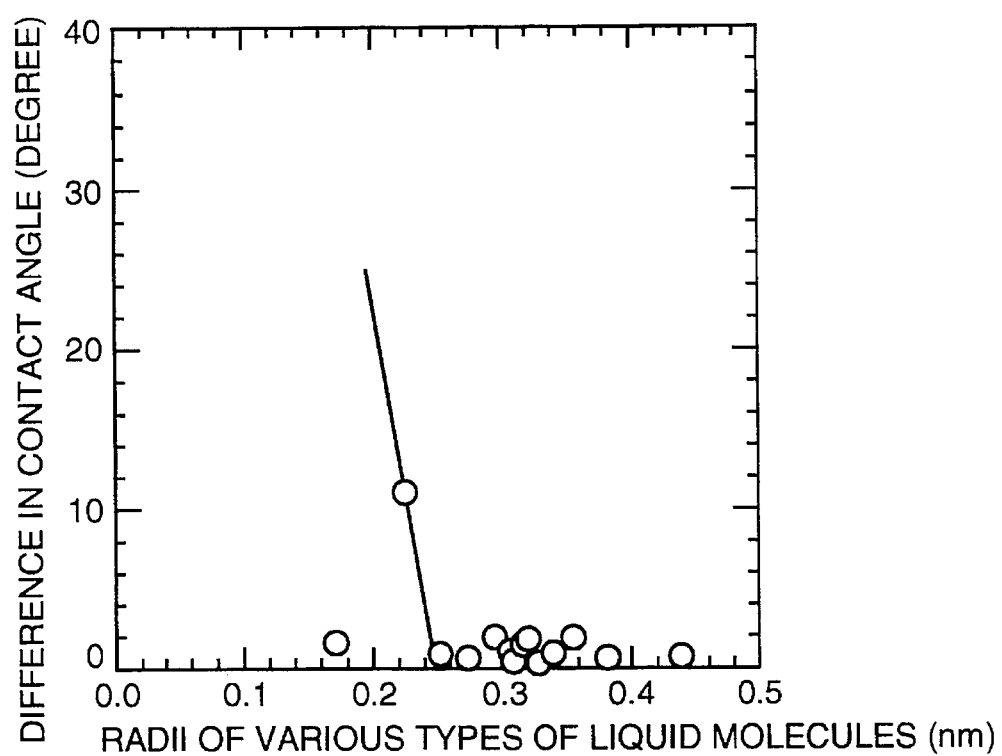
FIG. 2 is a view showing the relation between the radii of liquid molecules and the difference in contact angle from which an interstice of lubricant molecules is determined.

When the relation between the liquid molecular radius and the difference in the contact angle is graphically represented by plotting the molecular radii of the respective liquids along the abscissa axis and the difference in the contact angle along the ordinate axis, the molecular radius at the first transition point of the difference of the contact angle is the radius of the interstice. One instance is shown in FIG. 2. FIG. 2 is concerned with Example 3 appearing hereinafter. It will be noted that with water, four or five molecules usually associate with one another, so that there is indicated a value smaller than the difference of the contact angle assumed from the radius of one water molecule.

$$4\pi r^3/3 = 0.74095 \, (Mw/N\rho) \tag{1}$$

The corrosion resistance was assessed by spraying an aqueous salt solution containing 0.1 mole/liter of NaCl, followed by observation of the surface of each magnetic recording medium through an optical microscope and determination of a reduction of saturation magnetization. The sliding durability was evaluated by a CSS (contact start and stop) test wherein the time it took for the initial torque exerted on a head during starting and stopping to be doubled was measured and recorded as an indication of sliding durability, since such a point in time is considered to be strongly related to sliding durability and can be consistently determined for all of the medium examples.

2000 according to the procedure of Example 1 (referred to as Examples 4h, 4i for the two lubricants formed on the (WMo)C protective film, Examples 4j, 4k for the two lubricants formed on the (ZrNb)N protective film, and Examples 4l, 4m for the two lubricants formed on the $(ZrY)O_2$ protective film). The thus obtained magnetic recording mediums (disks) were evaluated under the same

TABLE 1

| Ex. | Lubricant (End Group) | (Molecular Weight) | Washing | Film Thickness (nm) | Corrosion Resistance | Reduction of Magnetization (%) | Interstitial Radius (nm) | CSS Strength |
| --- | --- | --- | --- | --- | --- | --- | --- | --- |
| 1a | PEPE (carboxyl group) | (1000) | yes | 3 | ○ | 0 | 0.29 | 70 k times or over |
| 1b | " | | no | 4 | ○ | 0 | 0.31 | 50 k times or over |
| 1c | PEPE (piperonyl group) | (1000) | yes | 3 | ○ | 0 | 0.29 | 70 k times or over |
| 1d | " | | no | 4 | ○ | 0 | 0.31 | 50 k times or over |
| 2e | PEPE (carboxyl group) | (2000) | no | 7 | ○ | 0 | 0.26 | 100 k times or over |
| 2f | PEPE (piperonyl group) | (2000) | no | 6 | ○ | 0 | 0.26 | 100 k times or over |
| 3g | PFDA (carboxyl group) | | no | 2 | ○ | 0 | 0.25 | 100 k times or over |
| 4h | PEPE (carboxyl group) | (2000) | yes | 7 | ○ | 0 | 0.29 | 70 k times or over |
| 4i | PEPE (piperonyl group) | (2000) | yes | 6 | ○ | 0 | 0.29 | 70 k times or over |
| 4j | PEPE (carboxyl group) | (2000) | yes | 6 | ○ | 0 | 0.30 | 70 k times or over |
| 4k | PEPE (piperonyl group) | (2000) | yes | 7 | ○ | 0 | 0.31 | 70 k times or over |
| 4l | PEPE (carboxyl group) | (2000) | yes | 7 | ○ | 0 | 0.29 | 70 k times or over |
| 4m | PEPE (piperonyl group) | (2000) | yes | 6 | ○ | 0 | 0.30 | 70 k times or over |
| In | PEPE (carboxyl group) | (1000) | yes | 4 | x | 8 | 0.32 | 50 k times or over |
| Io | " | | no | 7 | x | 8 | 0.32 | 50 k times or over |
| Ip | PEPE (piperonyl group) | (1000) | yes | 4 | x | 8 | 0.33 | 50 k times or over |
| Iq | " | | no | 5 | x | 8 | 0.32 | 50 k times or over |
| Ir | PFPE (non) | (2000) | yes | 2 | x | 8 | 0.36 | 50 k times |
| Is | " | | no | 8 | x | 12 | 0.35 | 10 k times |

PFPE: perfluoroalkyl polyether, PFDA: perfluorodecanoic acid, In–Is: comparative examples.

EXAMPLE 2

The medium substrate (disk without the lubricating layer) made under the same conditions as in Example 1 was treated on its surface with a monomolecular lubricating layer according to the Langmuir-Blodgett (LB) method using a water vessel on which there was developed a perfluoroalkyl polyether lubricant having a molecular weight of approximately 2000 and the same polar group as in Example 1. The thus fabricated magnetic recording mediums or disks (Examples 2e and 2f) were evaluated in the same manner as in Example 1, with the results shown in Table 1.

EXAMPLE 3

The medium substrate (disk without the lubricating layer) made under the same conditions as in Example 1 had a monomolecular lubricating layer of perfluorodecanoic arid having a carboxyl group at ends thereof formed on the disk surface as a lubricating layer, according to a vacuum deposition technique. The thus fabricated magnetic recording medium (Example 3g) was evaluated in the same manner as in Example 1, with the results shown in Table 1.

EXAMPLE 4

A (WMo)C protective film, a (ZrNb)N protective film and a $(ZrY)O_2$ protective film were, respectively, formed on the magnetic film formed in Example 1 by sputtering using (WMo)C, (ZrNb)N and $(ZrY)O_2$ targets, respectively. The thickness of each of the layers is 40 nm. The resultant disks had an upper surface coating of a protective film 15 (medium substrates). The medium substrates were then coated with a lubricating film, without undergoing any prior surface modification or cleaning treatment, of each of the two lubricants set out in Example 2 having a molecular weight of about conditions as in Example 1, with the results shown in Table 1.

COMPARATIVE EXAMPLE 1

For comparison, the general procedures of Examples 1, 1b, 1c and 1d were repeated except that no surface modification treatment was applied. The same lubricants as used in Examples 1a, 1b, 1c and 1d were used, thereby forming lubricating layers, respectively, (Comparative examples In, Io, Ip, Iq). Moreover, the general procedures of Examples 1a and 1b were repeated except for the surface modification treatment and the lubricating layers were, respectively, formed on the protective film in the same manner as in Examples 1a, 1b using a perfluoroalkyl polyether which was free of any polar group at ends thereof (Comparative Examples Ir and Is). The thus fabricated magnetic recording mediums (disks) were assessed under the same conditions as in Example 1, with the results shown in Table 1.

The magnetic recording mediums of Examples 1a, 1b, 1c and 1d have a greater number of adsorption sites on the protective film resulting from the cleaning or surface treatment step than those mediums of Comparative Examples In, Io, Ip and Iq. This results in decreasing the size of the interstitial radius and therefore the corrosion resistance. For the magnetic recording mediums of Examples 2e and 2f, the manner of forming the lubricating film was changed, so that the interstitial radii were made smaller than those of Examples 1a–1d and the Comparative Examples. For the magnetic recording medium of Example 3g, a very thin lubricating film was formed by a vacuum deposition technique. Such a thin lubricating film contributes to decreasing the interstitial radius of the film molecules and consequently the corrosion resistance. For the magnetic recording mediums of Example 4, the resulting interstitial radius could be made not greater than 0.31 nm because the lubricating films were formed on the surface of (WMo)C, (ZrNb)N and (ZrY)O$_2$ as the protective films. In addition, the CSS strength increases substantially in proportion to the molecular interstitial radius, as shown in the Table.

Where the lubricating film was formed according to the Langmuir-Blodgett method or the vacuum deposition method as in Example 2 or 3, it was possible to make an interstitial radius which was smaller. Where the magnetic recording mediums were fabricated in the same manner as in Examples 2 and 3 except that no surface modification treatment was performed, the interstitial radius was slightly greater than those attained in Examples 2 and 3, but was not larger than 0.31 nm.

It was confirmed that similar results were obtained when using perfluoroalkyl polyethers having, as the terminal functional group thereof, a carbonyl group, a methoxycarbonyl group, a sulfo group, a sulfine group, an amino group, an azido group and a methylol group, or using the main chain structures of lubricants of —(CF$_2$CF$_2$CF$_2$O)n— and —(CF(CF$_3$)CF$_2$O)n—.

EXAMPLE 5

Figure 3A:
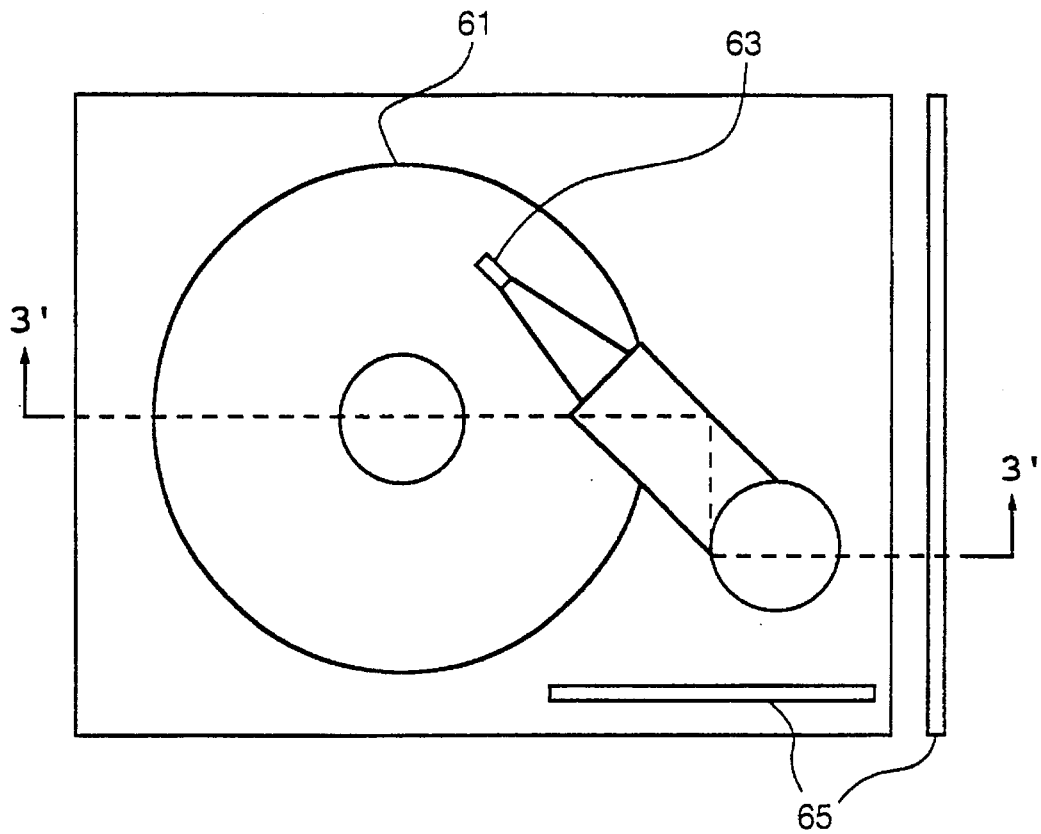
FIG. 3(a) is a schematic view showing a magnetic recording apparatus according to an embodiment of the invention.
Figure 3B:
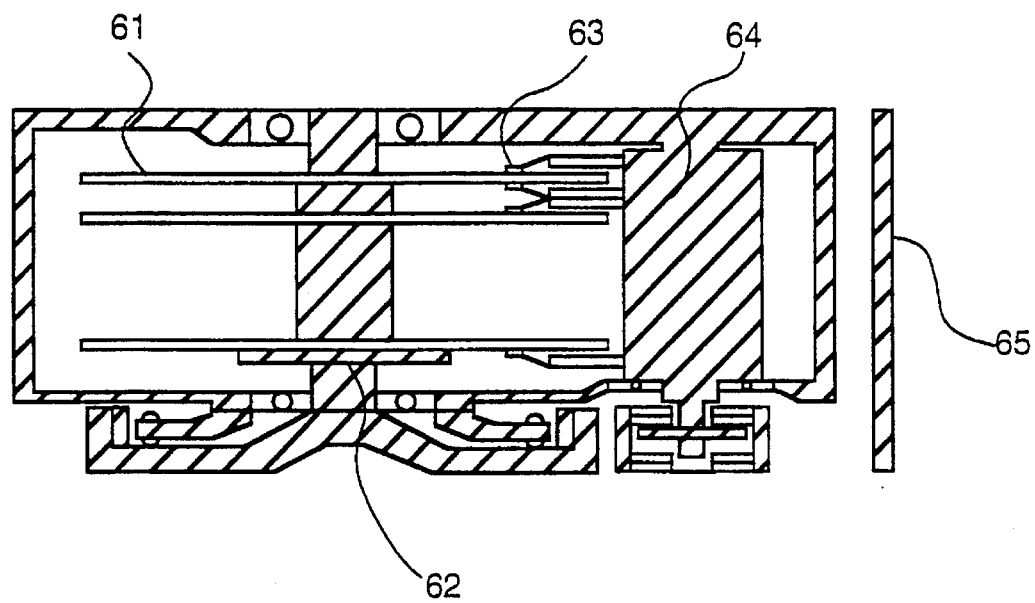
FIG. 3(b) is a sectional view thereof taken along line 3'—3' of FIG. 3(a).

A plan view of a magnetic recording apparatus according to the invention is shown in FIG. 3(a) and the sectional view taken along the line 3—3' of FIG. 3(a) is shown in FIG. 3(b). A magnetic recording medium 61 is held with a holder connected to a magnetic recording medium drive unit 62. Magnetic heads 63 are, respectively, provided in face-to-face relation with the respective sides of the magnetic recording medium 61. The respective magnetic heads were driven by means of a magnetic head drive unit 64 based on signals from a recording and reproducing signal processing system 65.

The magnetic heads used were a thin film magnetic head of a playback and reproduction separation type and were used in combination with each of the mediums of the respective examples and comparative examples, thereby completing a magnetic disk apparatus. Using the magnetic recording mediums of the high reliability according to the invention, the reliability is improved to a level of not less than two times that of the known magnetic recording mediums. Thus, the mediums of the invention could be adapted for high capacity and high density recording. Especially, since the magnetic recording heads and the magnetic recording medium of the invention are unlikely to suffer damage, the reliability is improved by not less than one order of magnitude.

As a matter of course, the invention should not be construed as being limited only to disk-shaped magnetic recording mediums and magnetic disk apparatus, but is also applicable to magnetic cards having a magnetic film on side thereof.

As set out hereinbefore, the magnetic recording medium of the type wherein the molecular interstices of the lubricating film are made small exhibits good corrosion resistance and durability. When such a medium is used in a magnetic recording apparatus, a highly reliable apparatus can be realized.

We claim:

1. A magnetic recording medium, comprising:
   a non-magnetic substrate, a magnetic film formed on said non-magnetic substrate, said recording medium having an outermost lubricating layer of an organic polymer having molecules with interstices of not greater than 0.31 nm.

2. A magnetic recording medium according to claim 1, wherein said organic polymer of said lubricating layer is selected from the group consisting of a fluorine-containing organic compound and an organic compound(s) having a perfluoroalkyl chain(s).

3. A magnetic recording medium according to claim 1, wherein said organic polymer of said lubricating layer is a perfluoroalkyl polyether having a terminal functional group selected from the group consisting of a carbonyl group, a methoxycarbonyl group, a sulfo group, a sulfine group, an amino group, an azido group and a methylol group.

4. A magnetic recording medium according to claim 1, wherein said organic polymer is an organic compound selected from the group consisting of a carbonyl group, carboxyl group, methoxcarbonyl group, sulfo group, sulfine group, amino group, azido group, piperonyl group and methylol group as a functional group of the compound.

5. A magnetic recording medium, comprising:
   a non-magnetic substrate, a magnetic film formed on said non-magnetic substrate, a protective film formed on said magnetic film that has been cleaned with a surface treatment process, and a lubricating layer of an organic polymer having molecules with interstices of not greater than 0.31 nm formed on said protective film.

6. A magnetic recording medium according to claim 5, wherein said protective film is a carbon film of approximately 40 nm thickness formed by sputtering.

7. A magnetic recording medium according to claim 5, wherein said non-magnetic substrate includes a first rigid substrate of an alloy on which is plated a non-magnetic layer of Ni—P, and on which is sputtered an underlying film.

8. A magnetic recording medium according to claim 7, wherein said magnetic film is one of a Cr or a Cr alloy sputtered on said underlying film and having a thickness of approximately 40 nm.

9. A magnetic recording medium according to claim 5, wherein said organic polymer is a perfluoroalkyl polyether having a terminal functional group selected from the group consisting of a carbonyl group, a methoxycarbonyl group, a sulfo group, a sulfine group, an amino group, an azido group and a methylol group.

10. A magnetic recording medium according to claim 5, wherein said lubricating layer is a monomolecular lubricating layer of perfluorodecanoic acid having a carboxyl group at ends thereof formed by a vacuum deposition technique.

11. A magnetic recording medium, comprising:
    a non-magnetic substrate, a magnetic film formed on said non-magnetic substrate, a protective film formed on said magnetic film, and a lubricating layer of an organic polymer having molecules with interstices of not greater than 0.31 nm formed on said protective film.

12. A magnetic recording medium according to claim 11, wherein said protective film is formed by sputtering and wherein said protective film is selected from the group consisting of (WMo)C, (ZrNb)N and (ZrY)O$_2$.

13. A magnetic recording medium according to claim 12, wherein said organic polymer of said lubricating layer is a perfluoroalkyl polyether having a terminal functional group selected from the group consisting of a carbonyl group, a methoxycarbonyl group, a sulfo group, a sulfine group, an amino group, an azido group and a methylol group.

14. A magnetic recording medium, comprising:
    a non-magnetic substrate, a magnetic film of Cr or a Cr alloy formed on said non-magnetic substrate, a protective film selected from the group consisting of carbon, a metal carbide, a metal nitride and a metal carbide formed on said magnetic film and cleaned with a surface treatment process; and a lubricating layer of an organic polymer that is one of a fluorine-containing organic compound and an organic compound(s) having a perfluoroalkyl chain(s) having molecules with interstices of not greater than 0.31 nm formed on said protective film.

15. A magnetic recording medium according to claim 14, wherein said organic polymer of said lubricating layer is a perfluoroalkyl polyether having a terminal functional group selected from the group consisting of a carbonyl group, a methoxycarbonyl group, a sulfo group, a sulfine group, an amino group, an azido group and a methylol group.

16. A method of forming a magnetic recording medium on a non-magnetic substrate, comprising the steps of:

forming a magnetic film on said substrate;

forming a protective film on said magnetic film;

cleaning said protective film with a surface treatment process; and coating the surface of the protective film with an organic polymer lubricant layer to provide an interstitial radius between molecules of the lubricant layer that is not greater than 0.31 nm.

17. A method according to claim 16, wherein said protective film is formed by sputtering and is selected from the group consisting of (WMo)c, (ZrNb)N and (ZrY)O$_2$ and said lubricating layer is a perfluoroalkyl polyether having a terminal functional group selected from the group consisting of a carbonyl group, a methoxycarbonyl group, a sulfo group, a sulfine group, an amino group, an azido group and a methylol group.

18. A method of forming a magnetic recording medium on a non-magnetic substrate, comprising the steps of:

forming a magnetic film on said substrate;

forming a protective film on said magnetic film;

cleaning said protective film with a surface treatment; and coating the surface of the protective film with an organic polymer lubricant layer to provide an interstitial radius between molecules of the lubricant layer that is not greater than 0.31 nm.

19. A method according to claim 18, wherein said cleaning includes treating the surface of the protective film with a treatment selected from the group consisting of an ozone treatment, a CF$_4$ plasma treatment and an oxygen plasma treatment.

20. A method according to claim 18, wherein following said coating of said lubricating layer on said protective film, said lubricating layer is cleaned with a solvent to remove excess lubricant for controlling thickness of the lubricant layer.

21. A method according to claim 18, wherein said lubricating film is coated on said protective film by an LB method.

22. A method according to claim 18, wherein said protective film is formed of carbon to be approximately 40 nm thick by sputtering.

23. A method according to claim 18, wherein said magnetic film is formed of one of Cr or a CR alloy sputtered on said underlying film and having a thickness of approximately 40 nm.

24. A method according to claim 18, wherein said lubricating layer is formed as a monomolecular lubricating layer of perfluorodecanoic acid having a carboxyl group at ends thereof by a vacuum deposition technique.

25. A method of forming a magnetic recording medium on a non-magnetic substrate, comprising the steps of:

forming a magnetic film on said substrate;

cleaning the magnetic film with a surface treatment process; and forming an organic polymer lubricant layer on the magnetic film by vacuum deposition to provide an interstitial radius between molecules of the lubricant layer that is not greater than 0.31 nm.

26. A magnetic recording apparatus having at least one magnetic recording medium, a holder for holding said at least one magnetic recording medium, a magnetic recording medium drive unit for rotating said at least one magnetic recording medium, magnetic head means facing respective sides of said at least one magnetic recording medium, magnetic head drive means for driving said magnetic head, and recording and reproducing signal processing means for controlling said magnetic head drive means, said magnetic recording medium comprising:

a non-magnetic substrate, a magnetic film formed on said non-magnetic substrate, wherein said recording medium has an outermost lubricating layer of an organic polymer having molecules with interstices of not greater than 0.31 nm.

27. A magnetic recording apparatus according to claim 26, wherein said organic polymer of said lubricating layer on said at least one magnetic recording medium is one of a fluorine-containing organic compound and an organic compound(s) having a perfluoroalkyl chain(s).

28. A magnetic recording apparatus according to claim 26, further including a protective film formed on said magnetic film, wherein said lubricating layer is formed on said protective film.

29. A magnetic recording apparatus according to claim 28, wherein said protective film has an active surface with a plurality of polarization bonding sites of atoms for bonding to said lubricating layer, atoms being selected from the group consisting of carbon, nitrogen and oxygen atoms that are obtained by cleaning the surface prior to said lubrication layer being formed thereon.

* * * * *